United States Patent [19]
Robinson

[11] Patent Number: 5,469,057
[45] Date of Patent: Nov. 21, 1995

[54] METHOD AND APPARATUS FOR EXTENDING THE DYNAMIC RANGE OF DC-SQUID MEASUREMENTS USING A FLUX TRACKING LOOP

[75] Inventor: Stephen E. Robinson, Albuquerque, N.M.

[73] Assignee: University of New Mexico, Albuquerque, N.M.

[21] Appl. No.: 208,541

[22] Filed: Mar. 8, 1994

[51] Int. Cl.⁶ ................................................. G01R 33/035
[52] U.S. Cl. ........................... 324/248; 327/527; 505/846
[58] Field of Search ........................... 324/248; 505/845, 505/846; 327/527

[56] References Cited

U.S. PATENT DOCUMENTS

| | | | |
|---|---|---|---|
| 4,672,359 | 6/1987 | Silver | 340/347 |
| 4,977,402 | 12/1990 | Ko | 341/133 |
| 5,045,788 | 9/1991 | Hayashi et al. | 324/248 |
| 5,122,744 | 6/1992 | Koch | 324/248 |
| 5,291,135 | 3/1994 | Hotta et al. | 324/248 |

Primary Examiner—Walter E. Snow
Attorney, Agent, or Firm—Ray G. Wilson

[57] ABSTRACT

A SQUID system provides for tracking small input signals to a SQUID. A digital flux tracking loop provides for independently providing orthogonal error signal for signal and modulation feedback errors effective to form a flux tracking loop with the SQUID. A current source biases the SQUID with a current effective to cause the SQUID to output a periodic junction voltage $V_j$ having a period $\Phi_o$, the $V_j$ having an amplitude as a function of magnetic flux $\Phi$ within the SQUID. A first processor modulates the magnetic flux within the SQUID to output at least three junction voltages. A second processor combines the at least three junction voltages and outputs first and second signals functionally related to flux tracking errors arising from the signal and modulation lock errors, respectively, the first and second signals forming feedback signals effective to form a flux tracking loop with the SQUID. In one embodiment, the signal flux errors are integrated to output a digital signal functionally related to the input signal to the SQUID.

13 Claims, 6 Drawing Sheets

METHOD AND APPARATUS FOR EXTENDING THE DYNAMIC RANGE OF DC-SQUID MEASUREMENTS USING A FLUX TRACKING LOOP

COPYRIGHT STATEMENT

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever.

BACKGROUND OF THE INVENTION

This invention relates to detecting the output signal from a dc superconducting quantum interference device (dc-SQUID) and, more particularly, to the application of digital signal processing to detecting the output signal from a dc-SQUID.

A dc-SQUID is a sensitive device that is used to detect and quantify very weak magnetic signals, e.g., human or animal brain signals for magnetoencephalography studies. It will be appreciated that the magnetic field strength of a brain is on the order of $10^{-13}$ Teslas (T), while background magnetic fields from the earth are on the order of $10^{-5}$ T. Thus, the general background noise level is eight orders of magnitude greater than the signal sought to be detected.

In one approach to reducing the noise to signal conditions, dc-SQUID are used in magnetically shielded rooms. Adequately shielded rooms are complex to design and maintain and are not suitable for routine use of a dc-SQUID. Other techniques have included the use of superconducting coils arranged to cancel the input of extraneous magnetic noise and the use of superconducting surfaces to deflect the fields of distant magnetic sources away from the signal detection coils of the dc-SQUID. These techniques are relatively complex and the efficacy is subject to mechanical features and variations thereof.

Yet another problem with a dc-SQUID is the need to provide for signal tracking over a wide dynamic range. With conventional analog circuits, the range of measurable signals can be increased by selecting or adjusting the gain of that circuit. However, decreasing the gain of a circuit to allow measurement of larger signals will decrease its sensitivity to weak signals. In the gain selection method, the percentage error and the noise floor are some fraction of the peak signal allowed by any given range. That is, the dynamic range is usually some constant for all ranges. Further, the dynamic range of analog measuring systems is limited to the ratio of the peak signal allowed by the electronics to its noise floor.

Still another problem with conventional dc-SQUID signal circuits is maintaining linearity over a wide dynamic range. The operation of a dc-SQUID is well known, that is, the dc-SQUID has a bias current to bias the dc-SQUID in a transition region between a superconducting and normal conducting state, wherein the dc-SQUID outputs a periodic junction voltage as a function of applied magnetic flux, $\Phi$, where the period is $\Phi_o$ (defined as one flux quantum or /2e). A conventional analog circuit flux locked loop (FLL) holds flux within the SQUID to a constant value, i.e., the loop feedback current is used to cancel changes in flux induced by the input current. When the feedback current exceeds the maximum than can be supplied by the feedback circuit, flux lock is lost; the flux lock loop must be reset to a new lock point. A flux lock error can cause the lock point magnitude to be reset to the nearest multiple of $\Phi_o/2$. If the lock is moved to an adjacent flux cycle, there will be a gap between the flux lock points with a concomitant accumulation of errors in the output signal.

In accordance with my invention a digital flux-tracking loop (dFTL) is provided with a novel modulation-demodulation technique for extending the usable measurement range of the dc-SQUID by many orders of magnitude without compromising accuracy or resolution. As hereinafter used, the term "SQUID" means dc-SQUID.

Accordingly, one object of the present invention is to achieve a large dynamic range for the SQUID through continuous tracking of the flux quanta over the entire magnetic flux range of SQUID operation.

Another object of the present invention is to provide linearity for the dFTL through accurate determination of $\Phi_o$ in a modulation feedback loop.

Still another object of the present invention is to provide independent orthogonal feedback for maintaining flux tracking and modulation lock.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the apparatus of the present invention may comprise a digital flux tracking loop (dFTL) for tracking input signals to a SQUID. Current means biases the SQUID with a current effective to cause the SQUID to output a periodic junction voltage $V_j$ having a period $\Phi_o$, the $V_j$ having an amplitude as a function of magnetic flux $\Phi$ within the SQUID. First processor means modulates the magnetic flux within the SQUID to output at least three junction voltages. Second processor means combines the at least three junction voltages and outputs first and second signals functionally related to flux tracking errors arising from the signal and modulation lock errors, respectively, the first and second signals forming feedback signals effective to form a flux tracking loop with the SQUID.

In another characterization of the present invention, a method enables tracking input flux signals to a SQUID using a digital flux tracking loop (dFTL). A bias current is established in the SQUID effective to cause the SQUID to output a periodic junction voltage $V_j$ having a period $\Phi_o$, $V_j$ having an amplitude as a function of magnetic flux $\Phi$ within the SQUID. The magnetic flux $\Phi$ in the SQUID is modulated with a feedback magnetic flux having values of $\Phi_F$, $\Phi_{F+}\Phi_n/2$, $\Phi_{F-}\Phi_n/2$, and where $\Phi_F$ is the flux feedback signal and $\Phi_n$ approximates $\Phi_o$, to output at least three junction voltages. The at least three junction voltages are combined to output first and second signals, where the first signal is a flux tracking error signal for determining an instantaneous value of $\Phi_F$ for the subsequent modulation cycle and the second signal signal is a modulation amplitude error representing the deviation of $\Phi_n$ from $\Phi_o$, for correcting $\Phi_n$, where the first and second signals are feedback signals effective to form a flux-locked loop with the SQUID.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings.

DETAILED DESCRIPTION OF THE DRAWINGS

In accordance with my invention, a digital flux-tracking loop (dFTL) for a SQUID includes a novel modulation-demodulation system and technique for extending the usable range of the SQUID by many orders of magnitude, without compromising accuracy or resolution. The dFTL tracks the magnetic flux in the SQUID by operating as a null detector. That is, the dFTL adjusts the modulation points and amplitudes so as to follow the changes of flux within the SQUID. The flux within the SQUID is therefore not maintained at a constant value. When the flux within the SQUID exceeds the limits that the digital-to-analog (D/A) system can track, the dFTL finds a new null, within the D/A range, that is offset by $\Phi_o/2$ to provide a seamless transition.

Figure 1:
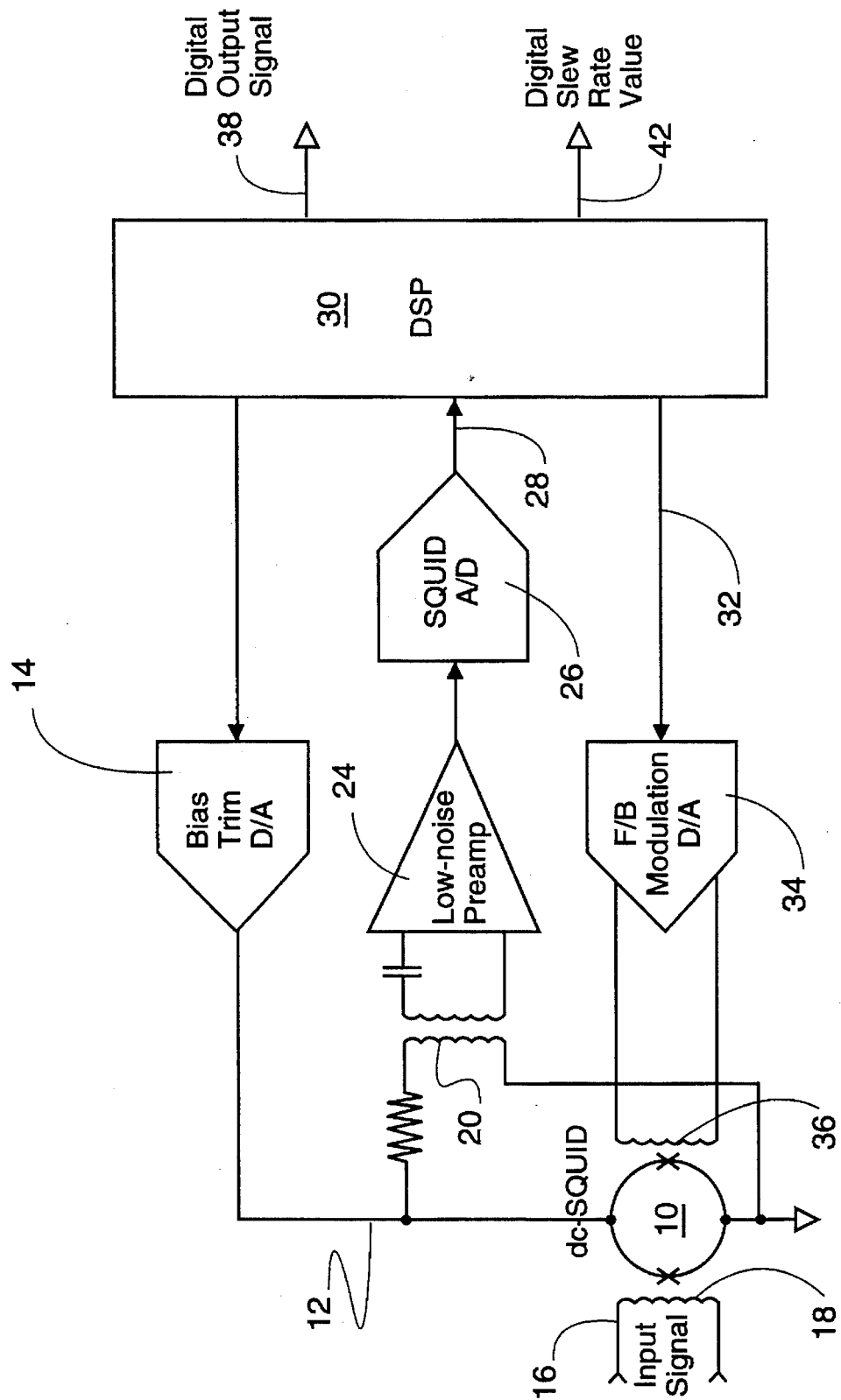
FIG. 1 is a circuit diagram, in block diagram form, of one embodiment of a SQUID digital flux tracking loop in accordance with the present invention.

Referring now to FIG. 1, there is shown a circuit schematic in block diagram form for one embodiment of the dFTL according to the present invention. SQUID 10 is biased by bias current $I_b$ 12 to an operating point within one of the symmetrical superconducting-non superconducting transition regions. In this region, if $I_b$ is maintained constant by bias digital-to-analog (D/A) converter 14, the output junction voltage $V_j$ of SQUID 10 is a periodic function of the magnetic flux $\Phi$ within SQUID 10. The period of the function is one magnetic flux quantum $\Phi_o$, as explained above.

Input signal 16, e.g., a current induced by a small magnetic field, such as produced by a human brain, produces an input signal magnetic flux through coil 18 to SQUID 10. The signal magnetic flux causes a variation in junction voltage $V_j$ across SQUID 10 with a concomitant signal current that may be inductively coupled 20 to low noise preamplifier 24, whose output is input to analog-to-digital (A/D) converter 26. Digital output 28 from A/D converter 26 is input to digital signal processor (DSP) 30. DSP 30 processes the digital signal 28 to determine a feedback value, which is combined with a modulation valve, also determined by DSP 35, to form (and modulate) signal 32 through feedback modulation D/A 34. Feedback digital signal 32 results in a current output from D/A converter 34 that is input to coil 36 to modulate and track the magnetic flux in SQUID 10. The magnetic flux in SQUID 10 is the sum of flux from coils 18 and 36. DSP 30 also outputs digital signal 38, which is a numerical value corresponding to input signal 16.

In a preferred embodiment, bias D/A converter 14 trims over the production range of the selected SQUID device, e.g., +20% about the critical current. An 8-bit D/A converter 14 designed for low-frequency operation is usually adequate. If bias-reversal modulation, explained below, is needed for reduction of 1/f noise, a wider range of D/A converter 14 may be needed to directly generate the bias modulation. Independent values of positive and negative SQUID bias current 12 to bias SQUID 10 in opposite transition regions can be generated, so that balanced, symmetrical operating points can be used.

SQUID signal A/D converter 26 preferably has a resolution in the range of 8 to 12 bits. The operating speed of converter 26 is greater than a factor equal to the number of modulation levels per unit time of the SQUID modulation. D/A converter 34 provides both modulation and feedback current through coil 36 to couple a corresponding magnetic flux to SQUID 10. D/A converter 34 has a current range effective to provide a magnetic flux range greater than 1.5 $\Phi_o$. D/A converter 34 preferably has 16 or more bits of resolution, high linearity, and is temperature stable. Again, the minimum conversion rate is a factor equal to the number of modulation levels per unit time.

Digital signal processor (DSP) controller 30 is conventional and contains RAM, ROM, and timer circuitry. DSP 30 implements the algorithms necessary for dFTL operation, e.g., modulation, detection, tune-up, and the like, as set out in the Program Listing Appendix. Tracking routines and flux-skipping routines (FIGS. 3 and 5) are interrupt-driven by a digital clock within DSP 30. These routines require little processing time in DSP 30, leaving adequate time for additional signal processing routines, e.g., bandpass equalization and adaptive cancellation of interference, that may be incorporated to improve signal quality.

Figure 2:
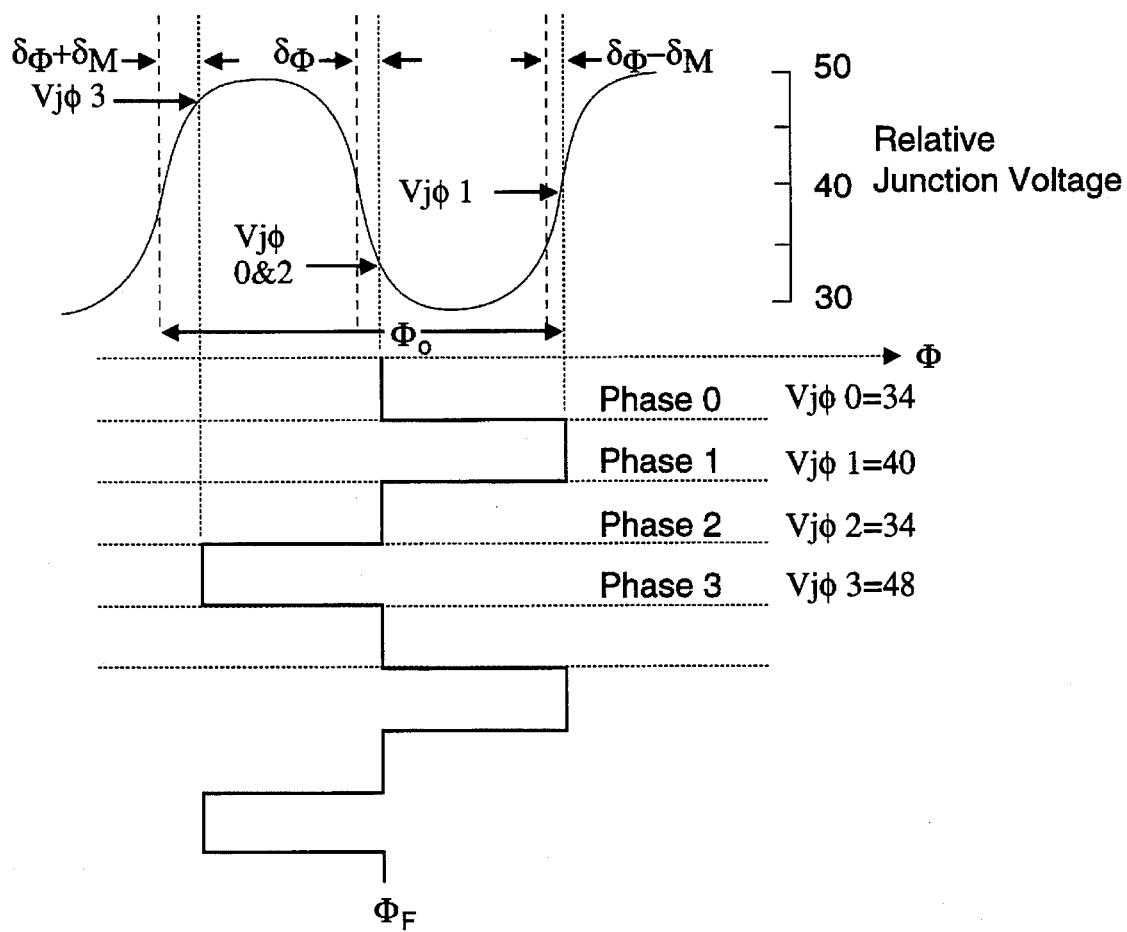
FIG. 2 graphically depicts the flux tracking and modulation lock errors determined by the circuit shown in FIG. 1.

In one significant aspect of my invention, three points in the $V_j$-$\Phi$ transfer function of the SQUID are modulated by a four-phase modulation current, as shown in FIG. 2, to measure orthogonal, i.e., independent, flux tracking and modulation lock errors. When biased at a critical current, $I_b$, SQUID junction voltage $V_j$ (neglecting SQUID noise) is described by:

$$V_j = \overline{V} - k\cos(2\pi\Phi/\Phi_o),$$

where $\overline{V}$ is the average junction voltage.

The phase modulation scheme can be visualized as alternating cycles of $\Phi_n/2$ amplitude square waves of opposite phase, modulating two adjacent half-quantum flux periods, where $\Phi_n$ approximates $\Phi_o$ within the modulation error, described below. At lock the flux corresponding to each of the three modulation points is:

$$\Phi(0) = (n\Phi_o/2) + (\Phi_o/4),$$

$$\Phi(1) = ([n+1]\Phi_o/2) + (\Phi_o/4),$$

$$\Phi(2) = (n\Phi_o/2) + (\Phi_o/4), \text{and}$$

$$\Phi(3) = ([n-1]\Phi_o/2) + (\Phi_o/4).$$

When the dFTL is operating, let the flux error at lock be denoted by $\delta_\phi$ and the modulation error by $\delta_M$. The SQUID junction voltages, measured during each of the four modulation phases, for small values of error are:

$$V_j(0) = \overline{V} - k\sin(\delta_\phi) \approx \overline{V} - k\delta_\phi,$$

$$V_j(1) = \overline{V} - k\sin(\delta_{\phi + [\pi + \delta_M]}) \approx \overline{V}k(\delta_\phi + \delta_M),$$

$$V_j(2) = \overline{V} - k\sin(\delta_\phi) \approx \overline{v} - k\delta_{100},$$

$$V_j(3) = \overline{V} - k\sin(\delta_\phi - [\pi + \delta_M]) \approx \overline{V} + k(\delta_\phi - \delta_M),$$

Looking at the modulation for each of the alternating $\Phi_n/2$ peak-to-peak square waves, each half contains both flux and modulation error terms:

$$V_j(0) - V_j(1) = -k(2\delta_\phi + \delta_M), \text{ and}$$

$$V_j(2) - V_j(3) = -k(2\delta_\phi - \delta_M).$$

By combining all four phases, i.e., taking the sum and difference of the above two-phase errors, two orthogonal detection channels are obtained for measuring the flux tracking and modulation amplitude errors:

$$\epsilon_\Phi = [V_j(0) - V_j(1)] + [V_j(2) - V_j(3)] = -4k\delta_\phi, \text{ and}$$

$$\epsilon_M = [V_j(0) - V_j(1)] - [V_j(2) - V_j(3)] = -2k\delta_M.$$

The feedback signal for tracking the flux is derived by integrating the flux error signal:

$$\Phi_F(t) = \Phi_F(t-1) + g_\phi \epsilon_\phi,$$

where $g_\phi$ is the flux feedback gain. Since the dFTL feedback $\Phi_F(t)$ tracks the flux changes within the SQUID rather than holding the flux at a constant value, the flux feedback gain is selected to exactly compensate for the flux change predicted by the error signal. A flux slipping (tracking) algorithm, described below in FIGS. 3 and 5, permits lock to be maintained within the D/A converter range, while counting the number of $\Phi_o/2$ periodicities that have been slipped beyond the dynamic range of the current supplied by D/A converter 34. The total instantaneous flux represented numerically within DSP 30 is equal to the sum of the feedback signal 32 and the total flux that has slipped beyond the dynamic range of D/A converter 34.

The digital feedback gain of the flux detector is computed from the SQUID output voltage and the gain and resolution of the A/D 26 and D/A 34 converters (FIG. 1). For small signal excursions, the A/D 26 transfer function ha($\Phi_o$/LSB), where LSB is the value of the converter least significant bit, is:

$$h_a = V_a/(4\pi V_{pp}2^N),$$

where Vpp is the peak-to-peak SQUID voltage, $V_a$ is the A/D converter 26 voltage input range (rail-to-rail), and N is the number of bits of resolution of A/D converter 26. The factor of four in the denominator appears due to summation over four modulation phases. D/A converter 34 transfer function $h_b$(LSB/$\Phi_o$) is given by:

$$h_b = 2^M/\Phi_{pp},$$

where M is the number of bits of resolution of D/A converter 34, and $\Phi_{pp}$ is the D/A converter 34 output range in magnetic flux quanta. Combining these two equations, the required feedback gain g is:

$$g_\phi h_a h_b = V_a 2^M/(4\pi V_{pp} \Phi_{pp} 2^N).$$

This is the feedback gain for small error signals that precisely compensates the corresponding input flux change. The gain for larger error signals declines as a $\cos(2\pi\delta_\phi/\Phi_o)$ function. This decline can be compensated for by an inverse function that increases gain in proportion to the error signal (proportional feedback), making the flux feedback equation:

$$F(t) = F(t-1) + h_b \sin^{-1}\left(\frac{h_a \epsilon_\phi}{2\Phi_{pp}}\right)/2\pi.$$

The limit of $\Phi_o/4$, for which the detector gain falls to zero, must be avoided by use of a discriminator algorithm.

Since the dFTL algorithm must lock the modulation current amplitude to $\Phi_o/2$, the modulation gain $g_M$ is selected to minimize the effects of SQUID noise on the modulation lock point. The modulation amplitude $A_M$ is:

$$A_M(t) = A_M(t-1) + g_M \epsilon_M(t-1).$$

The maximum available slew rate, i.e., signal change rate, of a digital SQUID controller can be estimated from the maximum error signal and the sample clock rate. Since the maximum error signal per sample is $\Phi_o/4$, the maximum slew rate will be given by:

$$\text{Slew rate}_{MAX} = \Phi_o f/4,$$

where f is the acquisition rate in samples/second. The theoretical slew rate limit assumes that the combination of SQUID, preamplifier, and A/D converter have no phase delay, and are noiseless. For a proposed application using a 500 kSample/s rate, the theoretical slew rate limit is 125,000 $\Phi_o$/s. In a test simulation (using$_{proportional\ feedback}$) with 5 $\mu\Phi_o$-Hz$^{-\frac{1}{2}}$ SQUID noise and 500 kSamples/s, a slew rate limit of 111,000 $\Phi_o$/s was obtained.

The operation of the flux-tracking error and modulation lock tracking process is shown by reference to FIGS. 1 and 2. A modulation current amplitude of $\Phi_n$ peak-to-peak is generated by feedback/modulation D/A converter 34. The modulation is a square-wave, having three operating points at amplitudes of $\Phi_F \pm \Phi_n/2$ in 4 clock phases. As used herein, $\Phi_F$ denotes the amplitude of the feedback current with a flux error component; $\Phi_n$ is a modulation amplitude that approaches $\Phi_o$. SQUID A/D converter 26 reads the junction voltage $V_j$ at each of the modulation phases into separate memory registers in DSP 30. Modulation transition-to-detection phase delays, imposed by the characteristics of SQUID matching transformer 20 and preamplifier 24, are implemented in software through the use of a time delay between the modulation interrupt routine and the detection interrupt routine (see FIGS. 3 and 5). SQUID junction voltages from the detection phases are processed into two orthogonal error components, discussed above.

In an exemplary embodiment with four modulation steps, a flux error value $\delta_\phi$ is generated by combining A/D converter 26 values of $V_j$ for detection phases (0–1)+(2–3) or (1–0)+(3–2), as needed to maintain a negative feedback polarity. It should be noted that, in the flux error determination, the modulation appears to be a simple square wave with a $\Phi_n/2$ peak-to-peak amplitude, i.e., two of the four phases of modulation are folded into the same amplitude. DSP 30 integrates the output of the flux error detection channel; the error signal corrects $\Phi_F$ and is fed back through D/A converter 34 to produce a null output from SQUID 10. Integration is performed by summing the scaled error signal to the total signal value.

The modulation error $\delta_M$ is generated by combining the $V_j$ detector phases (0–1)–(2–3). The modulation error is a deviation of $\Phi_n/2$ from the nominal $\Phi_o/2$ amplitude of the alternating square waves. This error is orthogonal to the flux error $\delta_\phi$, i.e., the error is sensitive to changes in modulation amplitude but not to changes in flux. The modulation error is null when the modulation amplitude is exactly $\Phi_o$ peak-to-peak. Modulation error signals appear as copies of the original four-phase modulation, with polarity depending upon the sign of the error. DSP 30 is programmed to account for the portion of the signal coupled from the modulation coil 36 to SQUID preamplifier 24, the portion of the signal arising from imbalances, and other signal errors arising from the dFTL. The amplitude of any coupling is determined during the SQUID tune-up with bias current removed from the SQUID. The determined quantity is used during operation of the dFTL to subtract the coupling error from the modulation signal. The modulation error signal is integrated to yield an accurate and increasingly refined value of $\Phi_n/2$ for subsequent modulation-detection cycles, i.e., $\Phi_n$ approaches $\Phi_o$.

A table of modulation values $\Phi_n$, indexed by ½ the flux quantum intervals and direction, is maintained in memory in DSP 30. Initially, the table contains the same current (D/A) value for each flux quantum. As input signal 16 sweeps over the range for SQUID 10, the values are refined to reflect an accurate value of current per flux quantum. The table may then be used to compensate for the hysteretic characteristics of SQUID 10, as can occur when flux is allowed to change within SQUID 10.

The overall detection scheme is graphically depicted in FIG. 2, for which, by way of example, the modulation points deviate from the null conditions for both flux errors and modulation errors. By way of example for the relative junction voltages depicted, error $\delta_\phi$ is calculated from the voltages in phases (0–1)+(2–3)=(34–40)+(34–48)=–20; the modulation error is (0–1)–(2–3)=(34–40)–(34–48)=8.

Figure 3:
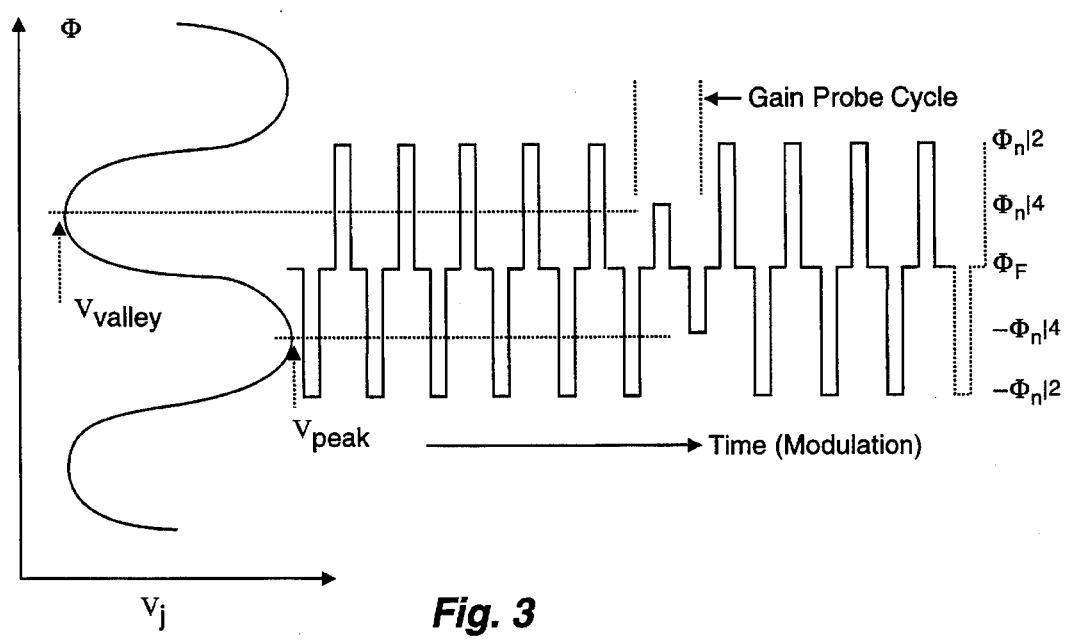
FIG. 3 is a processor flow diagram for computing a feedback signal.

The error processing routine is more particularly shown in FIG. 3, which uses the following nomenclature:

SIG: Total Signal—Sum of FSIG and CSIG (a 32 bit or greater number).

FSIG: Fine Signal—Flux value within D/A converter range (a 32 bit or greater number, truncated to the D/A resolution).

CSIG: Coarse Signal—Flux value in increments of MOD ($\Phi_o/2$)(a 32 bit or greater number).

MOD: Modulation Value in D/A units—MOD is nominally $\Phi_o/2$; MOD[n$\Phi_o/2$, sign (d$\Phi$/dt)] is maintained in a DSP 30 table (a 32 bit or greater number which may be truncated to the D/A resolution).

D0–D3: A/D Converter 26 value of SQUID junction voltage $V_j$—for each of four modulation phases.

g: Flux Error integration constant—selected to provide critical closed-loop damping.

h: Modulation Error integration constant—selected to provide critical closed-loop damping.

Flux Error: Flux Error sum of $V_j$ over four phases.

Mod Error: Modulation Error sum of $V_j$ over four phases.

EMAX: Maximum Error Signal—there are two error signals, therefore two discriminator thresholds; EMAX is used to represent both.

When a detector timer interrupt 100 is generated, a modulation phase is identified 102 and the digital value output from D/A converter 26 (FIG. 1) is stored: D0 104, D1 106, D2 108, and D3 110. The polarity of the modulation (see discussion of FIG. 5) is checked and the flux error is determined as (D0–D1)+ (D2–D3) 114 or as (D1–D0)+ (D3–D2) 116. The modulation error is then determined as (D0–D1)–(D2–D3) 118. The errors are compared 122 against a selected maximum error that might be expected. If the errors exceed the maximum error, no new feedback signal is computed, feedback is maintained constant, and the routine returns from the error detection interrupt. If the errors are within the error limits, then the flux error signal and modulation error signal are computed and a combined feedback signal SIG 124 is generated.

Figure 4:
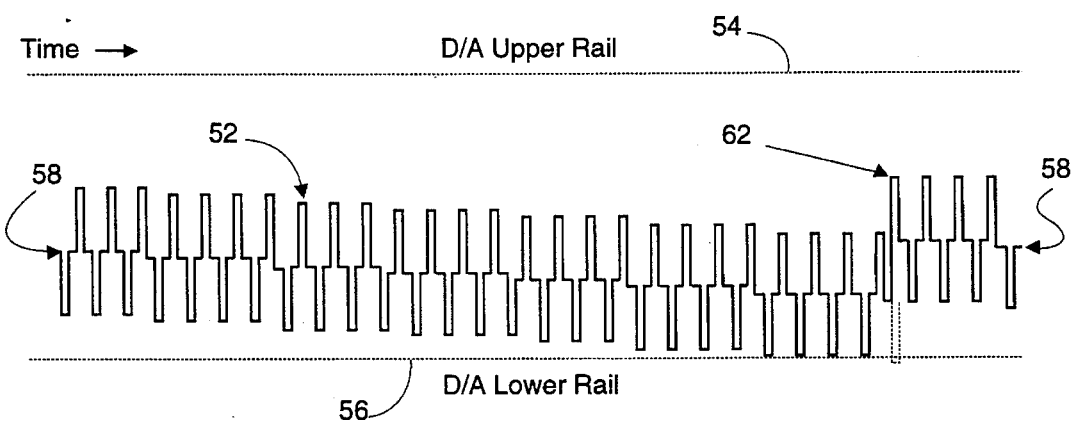
FIG. 4 graphically depicts the modulation offset obtained by the present invention to maintain modulation within the system dynamic range.

A particular improvement provided by the process of this invention is to track magnetic flux generated by current signal 16 seamlessly across $\Phi_o/2$ boundaries, as graphically shown in FIG. 4. As a result, the dynamic range of the system is not limited by the range of D/A amplifier 34. When the sum of feedback and modulation values 52 requires that D/A converter 34 generate a modulation current beyond its positive 54 or negative 56 limits, the dFTL process described herein offsets the feedback $\Phi_F$ 58 of D/A 34 by the current value of $\Phi_n/2$ in the opposite direction from the limit being reached and the modulation polarity is inverted to reset modulation point 62 within the limits of D/A converter 34. The offset is added to or subtracted from the integrated signal, as appropriate, and the portion of the integrated signal with the range of D/A converter 34 is used to continue tracking flux. If the D/A current corresponding to one magnetic flux quantum has been accurately determined, the flux slip results in no error signal, i.e., the flux tracking is seamless.

Figure 5:
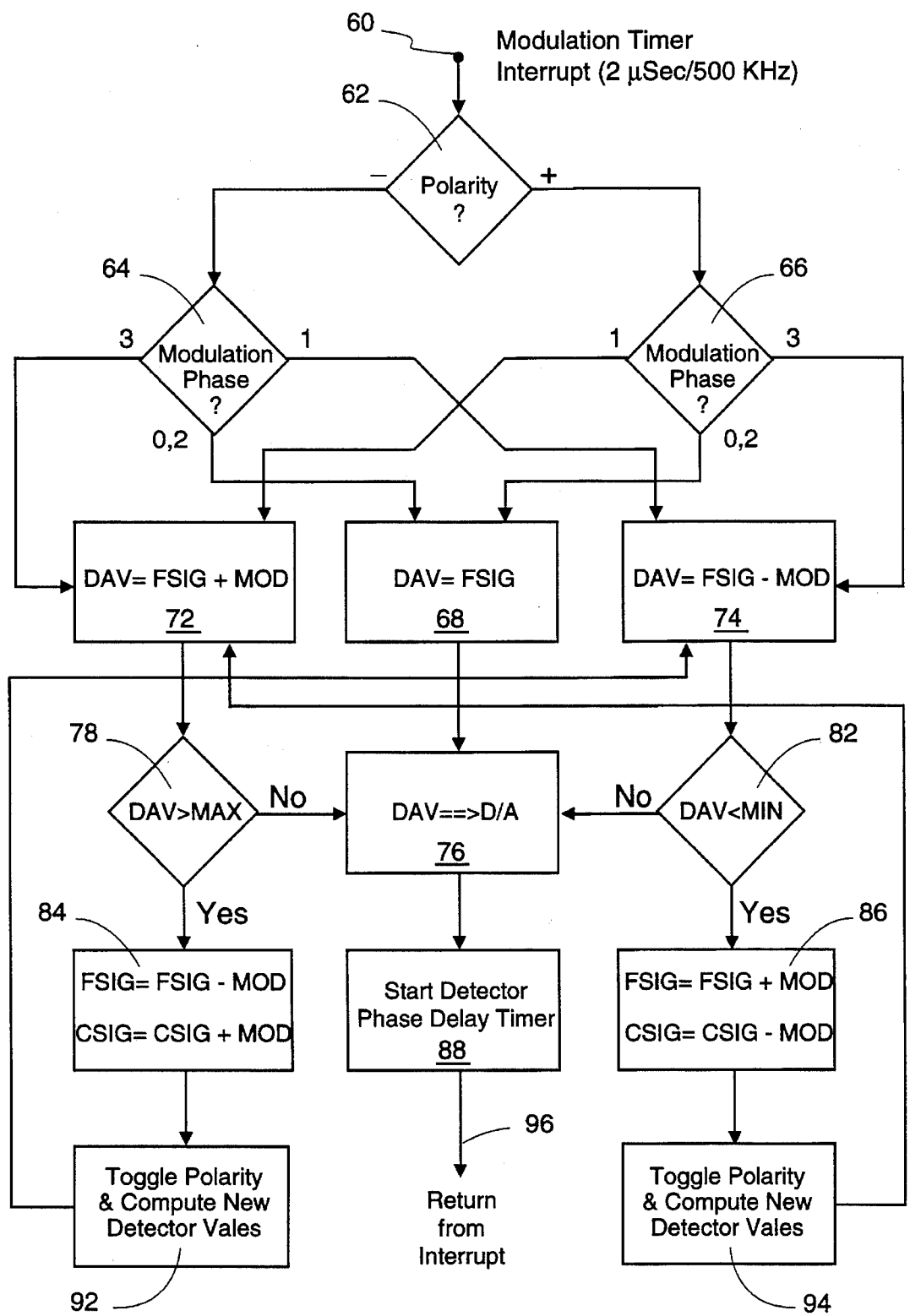
FIG. 5 is a processor flow diagram for initiating modulation detection of detector values.

A flux-slip of $\Phi_n/2$ can be generated on modulation phases 1 or 3, i.e., when the numeric value of the modulation pulses, corresponding to plus or minus $\Phi_n/2$, are tested for D/A limits prior to conversion. If a D/A limit is reached, a flux slip of $\Phi_n/2$ is executed, as shown in FIG. 5 and discussed below. During the modulation polarity transition, SQUID junction voltage $V_j$, saved in DSP 30 from the previous four phases, may be incorrect, since the transition did not occur at modulation phase 0. Subsequent modulation cycles are unaffected by the transition phase error until the next flux-slip transition occurs. Correct error detection following a flux-slip transition requires that new error values be estimated from the previous four detection values, e.g., by averaging the values of adjacent phases. Use of this correction assumes that only flux error dominates:

$$D0'=(D1+D3)/2;\ D1'=(D0+D2)/2;\ D2'=(D1+D3)/2;\ D3'=(D0+D2)/2.$$

The symbols D0 through D3 refer to the output values from detector SQUID 10/preamplifier 26 stored for the previous four phases. The primed symbols refer to the updated detector values.

FIG. 5 depicts a flow chart for maintaining the current of D/A converter 34 with its upper and lower rail limits. The following variables are identified in addition to the variables identified for FIG. 3:

DAV: D/A converter 34 (a 16 or greater bit number, representing combinbed modulation and feedback applied to SQUID 10).

MIN, MAX: Minimum and maximum D/A converter 34 rail values.

Modulation timer interrupt 60 initiates the sequence. The polarity of the modulation is checked 62 to determine the routing 64 or 66 of the modulation phase values. The DAV is determined for phases 1 and 3 at $\pm \Phi_n/2$ 72, 74 prior to their conversion and compared with the maximum 78 and minimum 82 rail values. Phases 0 and 2 are set 68 to their FSIG value. If an upper or lower rail value is found in comparisons 78 or 82, a flux slip of $\Phi_n/2$ is executed 84 or 86. Since the polarity of the modulation will then be inverted, the polarity of the flux error detection process must also be inverted 92 or 94 so that negative feedback is maintained. The polarity of the modulation error algorithm is independent of the modulation polarity and remains unchanged. If the D/A signal 32 is within the rail limits, the values are converted 76 to analog values for feedback to SQUID 10 and the routine is returned 96 from the interrupt through delay timer 88.

The D/A converter 34 digital value for modulation current, corresponding to $\Phi_n/2$, must be known precisely so that there is no error in the digitally measured values, when slipping flux in half-quanta intervals. The presence of errors in the D/A value for the magnetic flux quantum will correspond to measurement errors.

Initially, only a nominal value of the D/A 34 current corresponding to one half flux-quantum $\Phi_n/2$ is known. Since this error corresponds to a modulation error, the feedback loop will refine this value to the nearest LSB on the D/A ladder. In fact, $\Phi_n/2$ can approach $\Phi_o/2$ to better than one LSB, because the modulation error signal is integrated over time. Since the D/A current per half flux-quantum can change, as flux changes in SQUID 10 (note that flux is not conserved in this flux-tracking scheme), a new digital value for $\Phi_n/2$ is needed for each flux-quantum period in the input-output transfer function. However, as noted above, DSP 30 maintains a table, numbered in half flux-quantum intervals, of the refined digital values (to smaller than the D/A LSB). The tables are preferably directional (d$\Phi$/dt), accounting for hysteresis within SQUID 10. The values within the table are constantly refined as each half flux-quantum is sampled by the modulation so that the dFTL is automatically maintained in a linear state.

In yet another feature of the present invention, a maximum slew rate, i.e., rate of signal change, is maintained by measuring the open loop gain of SQUID 10 and preamplifier 24 while in the closed loop condition. This gain is then used conventionally to adaptively set critical loop damping to assure that the maximum slew rate is available without compromising loop stability. In convention flux-locked loops, slew rate is either fixed or is switch selectable to maintain a lock on rapidly changing signals or to compensate for unlocking from rf interference.

Figure 6:
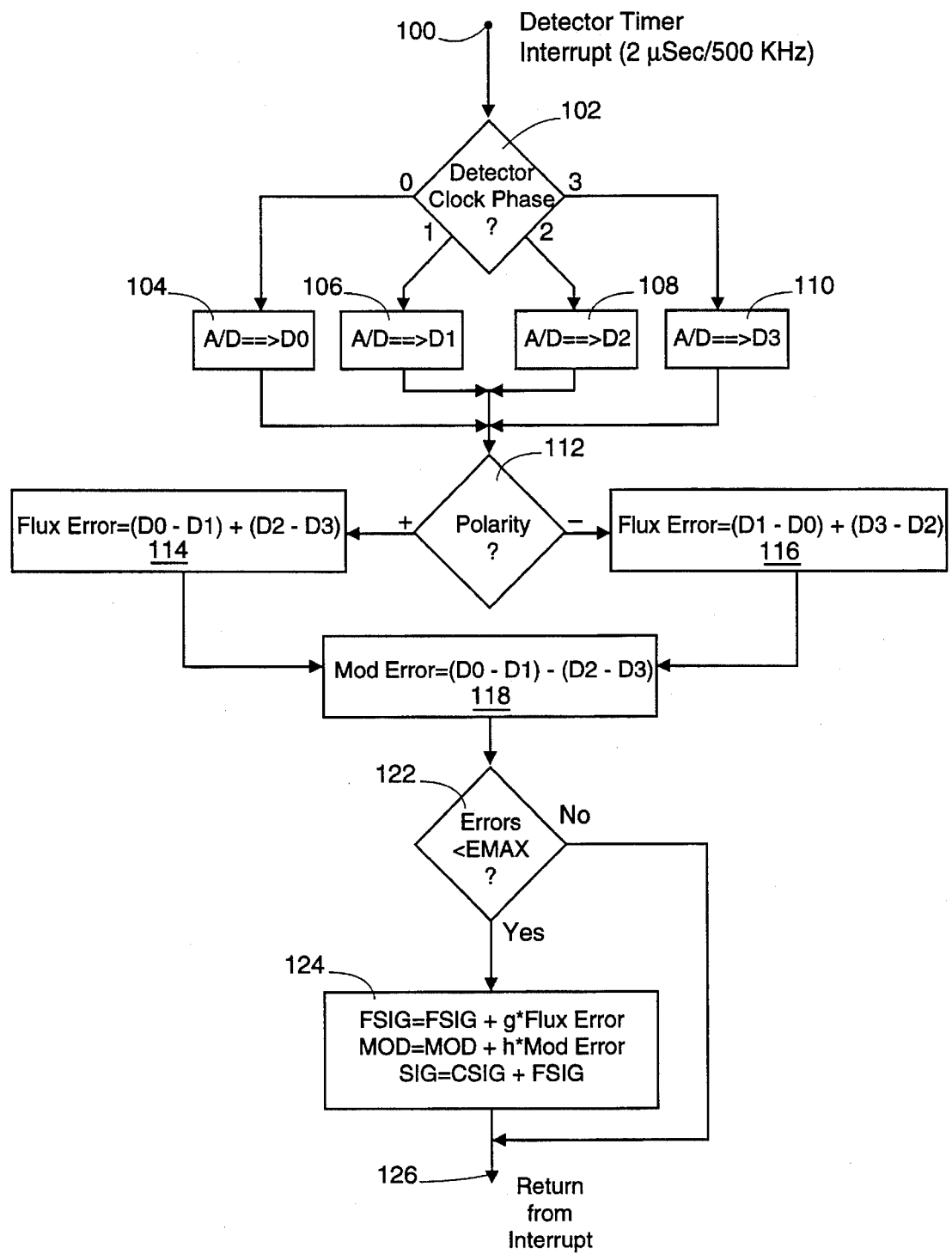
FIG. 6 graphically depicts an open loop SQUID gain determination during closed loop operation according to the present invention.

In order to measure open loop SQUID/preamplifier gain, modulation values of $\Phi_n/4$ from the null point are periodically introduced, e.g., in 1 out of 100 cycles or 1% of the modulation cycles. As shown graphically in FIG. 6, this change of modulation value provides a peak-to-valley measure of the input junction voltage $V_j$, i.e., a measure of the SQUID/preamplifier gain. The measured value of SQUID/preamplifier gain is then used to adaptively set the integration time constant to assure loop stability. DSP 30 may then output a value 42 (FIG. 1) of the available slew rate.

A preferred embodiment of the dFTL shown in FIG. 1 may include several additional features, described below. Further, the operation of DSP 30 in performing the processes described above for forming the modulation pulses, flux-slipping, error detection procedure and determining open loop gain for SQUID 10 and preamplifier 24 is more particularly set out in the software listing of the Program Listing Appendix attached to and incorporated in this Description.

Coupling transformer 20 and preamplifier 24 used to measure SQUID 10 junction voltage $V_j$ may not have flat frequency and phase response. DSP 30 may then perform a real time inverse filtering operation on the amplified SQUID junction signals, prior to detection, minimizing the phase and amplitude errors in measuring the instantaneous junction voltage. This digital filtering may also shape the bandpass to minimize out-of-band signals from being detected. In addition to equalizing the bandpass, interference that is unrelated to the modulation frequency or its sidebands may be suppressed by a real time adaptive digital filter (not shown), prior to detection.

As discussed above, the dFTL tracks the magnetic flux in SQUID 10 by operating as a null detector. That is, the dFTL adjusts the modulation amplitude $\Phi_n/2$ and feedback amplitude $\Phi_F$ so as to follow the changes of flux within SQUID 10. The flux within SQUID 10 is therefore not maintained at a constant value. When the flux within SQUID 10 exceeds the limits that D/A converter 34 can track, the dFTL find a new null, with the range of D/A converter 3-4, that is offset by $\Phi_n/2$, as discussed above for FIG. 5. By contrast, an analog flux-locked-loop (FLL) holds flux within the SQUID to a constant value, where the FLL feedback current is used to cancel the changes in flux induced by the input circuit. When the feedback current needed to maintain cancellation of the flux change exceeds the maximum that can be supplied by the feedback circuit, flux lock is lost and the FLL must be reset to a new lock point.

Because the dFTL allows the magnetic flux within SQUID 10 to change, the modulation current per unit flux can also change. This occurs because the inductance of SQUID 10 may change as magnetic flux penetrates the superconducting material making up SQUID 10. The change of inductance is very small for superconducting coils of large area, but can be significant for SQUIDs. The area of the SQUID inductor is on the order of several square micrometers, and flux penetration causes a significant change in the effective inductor area. In addition, high-Tc SQUIDs can also exhibit considerable hysteresis with respect to how flux changes with modulation current. The dFTL, however, is measuring the current required to track the changes in magnetic flux within the SQUID. If the mutual inductance between the SQUID input coil 18 and SQUID 10, itself, were identical to that of the modulation/feedback coil 36 to SQUID 10, then changes in current within the input circuit would be precisely measured by the corresponding tracking current in the modulation/feedback circuit. In this manner, the dFTL can maintain linear measurement of current (not flux) in SQUID 10 input circuit 18, despite the nonlinearity of flux with respect to current.

In yet another enhancement, D/A converter 14 may be used to establish the optimum bias point for SQUID 10 while operating in the presence of low-frequency large-amplitude ambient input signals. DSP controller 30 enables the generation of a current sweep ramp, using the feedback/modulation D/A converter 34, to signal average the resulting $V_j$, measured by A/D converter 24, and determine its peak-to-valley amplitude to adjust the bias trim of D/A converter 14 for maximum junction amplitude.

The proposed method for establishing the correct bias uses the feedback/modulation D/A converter 34 to simultaneously generate two non-harmonically related sine waves of about $\Phi_o$ peak-to-peak flux. The frequencies are chosen to be above the 1/f knee for ambient magnetic signals, and not harmonically related to the power line frequency. The SQUID junction voltage time-series is measured by A/D converter 26. The predicted intermodulation (mixer) frequency of the two tones is detected through a narrow-band filter (FFT), and SQUID 10 dc bias 1:2 is adjusted to maximize one of the expected heterodyne frequencies. The SQUID "mixer" output will be maximum at the critical current. The procedure may use saved bias values as a starting point, and to determine junction behavior, i.e., flux trapping. If bias reversal modulation is used, independent values of bias current are determined for the positive and negative polarities, assuring symmetry.

Impulse noise discrimination may also be included in DSP controller 30 between the error detection and the integrators for flux and modulation amplitude. The discriminator prevents large error signals from perturbing the lock points. Large error signals may result from EMI transients appearing at the input circuit to the SQUID. A high amplitude noise spike of short duration might transiently change the lock point by some multiple of $\Phi_o/2$. However, if the transient $d\Phi_o/dt$ exceeds the maximum allowable value, it is preferable that the current value of the feedback and signal not be changed.

Figure 7:
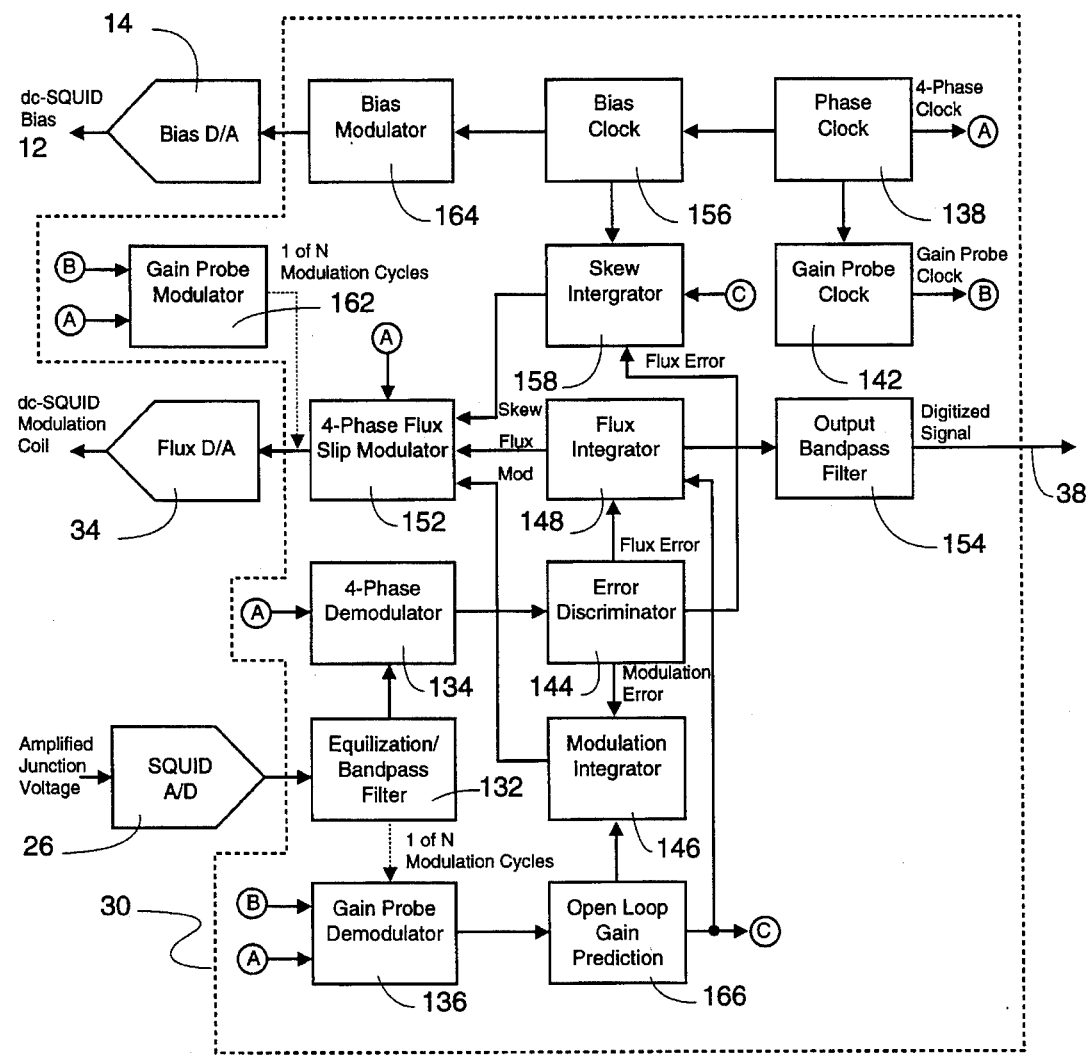
FIG. 7 is a functional block diagram of a digital signal processor for use in one embodiment of the present invention.

Referring now to FIG. 7, there is shown a functional block diagram of DSP 30 (FIG. 1) which may be implemented to hardware or software. A hardware implementation may be in either discrete components providing the stated functions or in an integrated circuit depending on the specific application of the SQUID apparatus. A software embodiment is particularly set out in the Program Appendix Listing. Internal signals are denoted by A,. B, and C. Components that are identical to the components referred to in FIG. 1 are identified by the same reference numbers.

An input analog signal, SQUID junction voltage $V_j$, is digitized by A/D converter 26 and input to an equalization/bandpass filter 132 to minimize phase and amplitude error. Filtered signals are then input to 4-phase demodulator 134 and gain probe demodulator 136. The operation of DSP 30 is controlled by clock 138. Clock 138 outputs a modulation clock A and clocks gain probe clock 142 to output a gain probe clock signal B every N modulation cycles.

Generation of the orthogonal flux and modulation errors is performed by error discriminator 144 using the clocked output from 4-phase demodulator 134 to perform the routine set out in FIG. 3. The flux error and modulation error are provided to flux integrator 148 and modulation integrator 146, respectively. Corrected feedback signals to produce a "null flux" and a $\Phi_n/2$ modulation are input to 4-phase flux-slip modulator 152. Flux-slip modulator 152 performs the routine set out in FIG. 5 and outputs a combined feedback signal to D/A converter 34 to generate the modulated feedback signal amplitudes, $\Phi_F$, $\Phi_F+\Phi_n/2$, $\Phi_F-\Phi_n/2$. An output signal from flux integrator 148 is input to bandpass filter 154 to form digitized output signal 38 (see also FIG. 1) that is functionally related to the flux value of input signal 16 in SQUID 10.

When an open loop gain is desired, as discussed above, gain probe modulator 162 is clocked by clock signals A and B to periodically modulate the SQUID flux at a phase appropriate to output a junction voltage to gain probe demodulator 136 to output a signal to open loop gain predictor 166. The predicted open loop gain is input to modulation and flux integrators 146, 148 to update the integration factors therein.

DSP 30 may incorporate bias reversal modulation wherein the bias current polarity is periodically reversed to switch between opposite transition regions. It will be understood that the transition regions are not exactly symmetrical and a skew error may be introduced during the switching. Bias clock 156 clocks the bias modulator 164 to switch the bias current 12 and clocks skew integrator 158, which outputs a flux error correction to modulator 152 to correct for bias reversal errors.

An implementation of DSP 30 in software is set out in the Program Appendix Listing. The program listing and the functional description shown in FIG. 7 will enable the invention to be performed in many different embodiments.

The foregoing description of the preferred embodiments of the invention have been presented for purposes of illustration and description. It is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

PROGRAM LISTING APPENDIX

```
/* dftl -- dFTL emulator
 *
 *      This digital flux tracking loop (dFTL) emulator is written in
 *      the "C" programming language. The dc-SQUID bias D/A converter,
 *      modulation/feedback D/A converter, and SQUID junction A/D
 *      converters are simulated in this software, together with the
 *      response characteristics of a hypothetical dc-SQUID. A triangular
 *      wave input signal is also simulated. This version of the dFTL
 *      procedure incorporates:
 *              1) 4-phase modulation & demodulation
 *              2) orthogonal detector channels for flux error & modulation error
 *              3) seamless flux slipping, extending the SQUID dynamic range
beyond the D/A range
 *              4) gain-probe cycle to measure open-loop gain & compensate
feedback
 *              5) bias reversal modulation with skew-error correction
 *              6) modulation table to compensate for hysteretic SQUID response
 *              7) proportional feedback for highest slew rate
 *
 *      A SQUID preamplifier bandpass equalization filter is not included, but
 *      could be placed at the beginning of the detection routine.
 *
 *      This code was written for demonstration & simulation purposes, & is
 *      not intended to represent optimized code for execution with actual
 *      SQUID & DSP hardware.
 *
 *      Author: SE Robinson
 *              Dept. of Physics & Astronomy, UNM
 *              Albuquerque, NM
 *      (C) Stephen E. Robinson, The University of New Mexico, 1993, 1994
 */ include <stdio.h>
```

```c
include <math.h> define SIG_AMPLITUDE     557.3    /*input signal: 557.3 phi0 peak*/
define SIG_SLEWRATE      0.05     /*input signal: slew rate (phi0 per tick) */
#define MOD_AMPLITUDE     0.5      /*initial modulation amplitude: 0.5 phi0*/
#define DA_RESOLUTION     18       /*18-bit D/A converter resolution*/
#define DA_RANGE          1.75     /*1.75 phi0 D/A converter range*/
#define AD_RESOLUTION     12       /*12-bit A/D converter resolution*/
#define AD_RANGE          200.     /*400 microvolt A/D converter range*/
#define SQUID_NOISE       0.175    /*SQUID noise (RMS microvolts)*/
#define SQUID_OUTPUT      25.      /*25 microvolts peak -- 50 microvolts peak-to-peak*/
#define SQUID_MEAN_P      80.      /* 80 microvolts mean SQUID signal at (+) bias point    */
#define SQUID_MEAN_N      (-70.)   /* -70 microvolts mean SQUID signal at (-) bias point*/
#define SQUID_SKEW        .05      /* 0.05 phi0 skew -- difference between lock points on (+)/(-) bias*/
#define PROBE_TC          4.       /*probe detector time constant*/
#define SKEW_TC           100.     /* skew time constant for mean FluxError per bias phase*/
#define MEAN_TC           1000.    /* detector mean value time constant*/
#define SKEW_INTEGRATOR   0.0005   /*skew integrator constant */
#define MOD_INTEGRATOR    0.00001  /*modulation integrator constant*/
#define BIAS_CYCLE        5        /* bias reversal every 5 modulation   cycles */
#define GAIN_PROBE        999      /* gain probe modulation cycle every cycles*/
```

```
#define PERIODS        384            /* number of 1/2 phi0 periods
                                         tracked*/
#define NEGATIVE       0              /*detector and modulator signs*/
#define POSITIVE 1     1              /*detector and modulator signs*/
define TWOPI          (2. * M_PI)    /* self explanatory*/ main()
{
    double Probe[4][2];        /* four probe phases' value for two bias
                                  polarities (D/A units)*/
    double Detector[4];        /*value of each of four detector phases (A/D
                                  units)*/
    double DetMean[2];         /* mean detector values for two bias polarities
                                  (A/D   units)*/
    double MeanError[2];       /*mean flux error for two bias polarities (A/D
                                  units)*/
    double Gain[2];            /* SQUID & preamplifier relative gain for two
                                  bias polarities (dimensionless)    */
    double Modulation[PERIODS] /* mean modulation amplitude for each
                                  1/2 phi0 (D/A units)*/
    double DetTmp;             /* temporary detector value*/
    double TotalFeedback;      /* total integrated flux feedback (extended D/A
                                  units)*/
    double Feedback;           /* feedback within D/A window limits (D/A
                                  units)*/
    double Skew;               /* difference in lock points between (+)/(-) bias
                                  (D/A   units)*/
    double SquidInSig;         /* instantaneous SQUID input signal (phi0)*/
    double SquidOutSig;        /* instantaneous SQUID output signal(μvolts)*/
    double SquidNoise;         /* instantaneous SQUID noise (μvolts)*/
    double InSig;              /* instantaneous external input signal to
                                  SQUID (phi0)*/
    double OutSig;             /*instantaneous output signal from dFTL
                                  (phi0)*/
```

```
        double ModPoint;              /* instantaneous modulation point (Modulation
                                         + Feedback + Skew) (D/A units)*/
        double ADµVoltsPerBit;        /* µvolts per LSB of A/D converter*/
        double DAPhi0PerBit;          /* phi0 per LSB of D/A converter*/
        double MeanSquidVoltage;      /* mean SQUID voltage (µvolts)*/
        double PeakToPeakSquidVoltage; /* peak-to-peak SQUID voltage (µ
                                         volts)*/
        double FluxError;             /* instantaneous flux error (A/D units)*/
        double ModError;              /* instantaneous modulation error (A/D units)*/
        double SkewError;             /* instantaneous skew error (A/D units)*/
        double PhiError;              /* instantaneous flux error (phi-0)*/
        double FractMaxError;         /* instantaneous flux error fraction of maximum
                                         error*/
        double DAScale;               /* D/A converter bit scale (bits resolution)*/
        double DAMax;                 /* D/A converter (+) rail value (D/A units)*/
        double DAMin;                 /* D/A converter (-) rail value (D/A units)*/
        double tmp;                   /* what else?*/
        double RandomGauss();         /* function to compute a gaussian random
                                         value*/
        int ModFlag;                  /* indicates which phase the modulation sign
                                         changed on*/
        int ModPhase;                 /* 4-phase flux modulation clock*/
        int BiasSign;                 /* bias polarity: NEGATIVE or POSITIVE*/
        int ModSign;                  /* modulation sign: NEGATIVE or POSITIVE*/
        int Slope;                    /*input signal slope: NEGATIVE or POSITIVE*/
        int ADScale;                  /* A/D converter bit scale (bits resolution)*/
        int ADVal;                    /*A/D converter value (A/D units--what else?)*/
        int t;                        /* time index*/
        int f;                        /* flux index -- half quantum steps*/

/* initialize hardware constants */
DAScale = pow(2., (double)DA_RESOLUTION);
DAMax = DAScale / 2. - 1.;
DAMin = 1. - DAScale / 2.;
```

```
              DAPhi0PerBit = DA_RANGE / DAScale;
              ADScale = (int)pow(2., (double)AD_RESOLUTION);
              ADµVoltsPerBit = AD_RANGE / ADScale;

5            /* initialize polarity, integrators, & detectors */
              BiasSign = POSITIVE;
              ModSign = POSITIVE;
              Slope = POSITIVE;
              ModFlag = -1;
10            TotalFeedback = 0.25 / DAPhi0PerBit;
              Feedback = Skew = 0.;
              for(f=0; f<PERIODS; f++)
                    Modulation[f] = (MOD_AMPLITUDE / DAPhi0PerBit);
              f = PERIODS / 2;                  /* reset to middle of flux range */
15            ModError = FluxError = SkewError = MeanError[POSITIVE] =
              MeanError[NEGATIVE] = 0.;
              Detector[0] = Detector[1] = Detector[2] = Detector[3] = 0.;
              DetMean[POSITIVE] = DetMean[NEGATIVE] = 0.;
              Probe[0][POSITIVE] = Probe[2][POSITIVE] = SQUID_MEAN_P / ADµ
20            VoltsPerBit;
              Probe[1][POSITIVE] = (SQUID_MEAN_P + SQUID_OUTPUT) / ADµ
              VoltsPerBit;
              Probe[3][POSITIVE] = (SQUID_MEAN_P - SQUID_OUTPUT) / ADµ
              VoltsPerBit;
25            Probe[0][NEGATIVE] = Probe[2][NEGATIVE] = (-SQUID_MEAN_N) / ADµ
              VoltsPerBit;
              Probe[1][NEGATIVE] = (-SQUID_MEAN_N + SQUID_OUTPUT) / ADµ
              VoltsPerBit;
              Probe[3][NEGATIVE] = (-SQUID_MEAN_N - SQUID_OUTPUT) / ADµ
30            VoltsPerBit;
              PeakToPeakSquidVoltage = 2. * SQUID_OUTPUT;
              Gain[POSITIVE] = Gain[NEGATIVE] = 1.;
              InSig = 0.;
```

```
/* "forever" loop over time points */
for(t=0;; t++) {

/* bias polarity clock */
    if((t % BIAS_CYCLE) == (BIAS_CYCLE - 1))
    BiasSign = (BiasSign == POSITIVE) ? NEGATIVE : POSITIVE;

/* loop for modulation clock phase */
    for(ModPhase=0; ModPhase<4; ModPhase++) {

/* compute triangular wave as instantaneous input signal, &
        SQUID noise */
        InSig += Slope * SIG_SLEWRATE;
        if(fabs(InSig) >= SIG_AMPLITUDE)
           Slope *= (-1);
        SquidNoise = RandomGauss(0., SQUID_NOISE);

/* determine if this is a normal or gain-probe cycle */
        if(t % GAIN_PROBE != GAIN_PROBE - 1) {

/* MODULATION PROCEDURE: compute combined
            feedback, modulation, & skew --*/
            /* output this value to the D/A converter; rules for each of
            four phases are:      */
            /* (phases 0 & 2) modulation point is equal to feedback, +/-
            skew (depending upon bias polarity)/
            /* (phases 1 & 3) modulation point is equal to feedback, +/-
            1/2 flux quantum*/
            /*modulation (depending upon modulation polarity), +/- skew
            (depending on bias polarity)/*
            ModPoint = (BiasSign == POSITIVE) ? Feedback + Skew :
                       Feedback - Skew;
```

```
        if((ModSign == POSITIVE && ModPhase == 1) || (ModSign
==              NEGATIVE && ModPhase == 3)) {ModPoint +=
                Modulation[f];
        if(ModPoint > DAMax) {

/* FLUX SLIP PROCEDURE: ModPoint exceeded the D/A (+) rail,
so:*/
                /* (1) offset feedback by modulation value in (-)
                    direction*/
                /*   (this is the half quantum slip);*/
                /* (2) subtract new modulation from flux value,
                    inverting the modulation polarity*/
                /* (3) toggle the modulator/detection sign,
                    flagging polarity*/
                /* (4) estimate the new detector values for this
                    polarity*/
                Feedback -= Modulation[f];
                ModPoint = (BiasSign == POSITIVE) ?
                    Feedback + Skew - Modulation[++f]:
                Feedback - Skew - Modulation[++f];
                ModSign = (ModSign == POSITIVE) ?
                NEGATIVE : POSITIVE;
                DetTmp = Detector[3];
                Detector[3] = Detector[2];
                Detector[2] = Detector[1];
                Detector[1] = Detector[0];
                Detector[0] = DetTmp;
                ModFlag = (ModPhase = 0) ? 3 : ModPhase-1;
            }
        } else if((ModSign == POSITIVE && ModPhase == 3) ||
            (ModSign == NEGATIVE && ModPhase == 1)) {
            ModPoint -= Modulation[f];
            if(ModPoint < DAMin) {
```

```
            /*FLUX SLIP PROCEDURE: ModPoint exceeded the D/A (-) rail, so:
    */
                    /* (1) offset feedback by modulation value in
                            (+) direction*/
                    /*    (this is the half quantum slip);*/
                    /* (2) subtract new modulation from flux value,
                            inverting the modulation polarity*/
                    /* (3) toggle the modulator/detection sign,
                            flagging polarity*/
                    /* (4) estimate the new detector values for this
                            polarity*/
                    Feedback += Modulation[f];
                    ModPoint = (BiasSign == POSITIVE) ?
                            Feedback + Skew + Modulation[--f]:
                            Feedback - Skew + Modulation[--f];
                    ModSign = (ModSign == POSITIVE) ?
                                    NEGATIVE : POSITIVE;
                    DetTmp = Detector[3];
                    Detector[3] = Detector[2];
                    Detector[2] = Detector[1];
                    Detector[1] = Detector[0];
                    Detector[0] = DetTmp;
                    ModFlag = (ModPhase =0) ? 3 : ModPhase - 1;
            }

/* simulation: compute instantaneous modulation in phi0, SQUID
                    signal μvolts, & A/D value */
                    SquidInSig = rint(ModPoint) * DAPhi0PerBit + InSig;
                    if(BiasSign == POSITIVE)
                            SquidOutSig = (SQUID_MEAN_P + SquidNoise) -
    SQUID_OUTPUT * cos(TWOPI * (SquidInSig + SQUID_SKEW));
                    else
                            SquidOutSig = (SQUID_MEAN_N + SquidNoise) +
    SQUID_OUTPUT * cos(TWOPI * (SquidInSig - SQUID_SKEW));
```

ADVal = rint(SquidOutSig / ADμVoltsPerBit);

/* DETECTION PROCEDURE: the SQUID junction voltage
is read out via the A/D*/
/* converter, & the current value combined with the values
from the prior three phases to compute the flux, modulation,
& skew error signals; these are then fed back to track
changes in flux, & to refine modulation, & skew values:*/
/* (1) rectify the A/D value, synchronous with the bias
polarity*/
/* (2) compute the average value of all detector phases for
present bias polarity, & subtract the average from the
current A/D value -- this removes the signal component due
to the bias reversal*/
/* (3) combine detector phases to extract flux, modulation, &
skew errors --note that the flux error computation depends
upon the modulation polarity, but that the modulation & skew
errors are independent of modulation polarity*/
/* (4) integrate error signals with flux, modulation, & skew
values/
if(BiasSign == NEGATIVE)
    ADVal *= (-1);
DetMean[BiasSign] = (MEAN_TC * DetMean[BiasSign] +
    ADVal) / (MEAN_TC + 1.);
Detector[ModPhase] = ADVal - DetMean[BiasSign];
if(t == 0)/* kludge to 'charge' or initialize detectors on t==0 */
    switch(ModPhase) {
        case 0: Detector[3] = Detector[2] = Detector[1]
            = Detector[0]; break;
        case 1: Detector[3] = Detector[2] = Detector[1];
            break;
        case 2: Detector[3] = Detector[2]; break;
            default: break;
    }

```
if(ModFlag == -1) {
        ModError = (Detector[1] - Detector[0]) - (Detector[3] -
                Detector[2]);
} else {
        ModError = 0.;
        if(ModFlag == ModPhase)
                ModFlag = -1;
}
if(ModSign == POSITIVE)
        FluxError = (Detector[1] - Detector[0]) + (Detector[3] -
                Detector[2]);
else
        FluxError = (Detector[0] - Detector[1]) + (Detector[2] -
                Detector[3]);
FractMaxError = FluxError / (2. * PeakToPeakSquidVoltage / if(FractMaxError > 1.)
        FractMaxError = 1.;
PhiError = asin(FractMaxError) / TWOPI;
MeanError[BiasSign] = (SKEW_TC * MeanError[BiasSign] +
                FluxError) / (SKEW_TC +
1.);
        SkewError = MeanError[POSITIVE] -
MeanError[NEGATIVE];
        Skew += SKEW_INTEGRATOR * SkewError /
Gain[BiasSign];
        TotalFeedback -= PhiError / DAPhi0PerBit / Gain[BiasSign];
        Feedback += PhiError / DAPhi0PerBit / Gain[BiasSign];
        Modulation[f] += MOD_INTEGRATOR * ModError /
Gain[BiasSign];
} else {
```

```
/* GAIN-PROBE CYCLE MODULATION PROCEDURE: compute by
modulation point for four phases* by adding +/- 1/4 flux quantum to feedback
value*/
        ModPoint = (BiasSign == POSITIVE) ? Feedback + Skew :
                              Feedback - Skew;
        if((ModSign == POSITIVE && ModPhase == 1) || (ModSign
                      == NEGATIVE && ModPhase == 3)) {
                ModPoint += Modulation[f] / 2.;
        } else if((ModSign == POSITIVE && ModPhase == 3) ||
   (ModSign == NEGATIVE && ModPhase == 1)) {
                ModPoint -= Modulation[f] / 2.;}

/* simulation: compute instantaneous modulation in phi0, SQUID
signal in μvolts, & A/D value */
        SquidInSig = rint(ModPoint) * DAPhi0PerBit + InSig;
        if(BiasSign == POSITIVE)
                SquidOutSig = (SQUID_MEAN_P + SquidNoise) -
                        SQUID_OUTPUT * cos(TWOPI *
                        (SquidInSig + SQUID_SKEW));
        else
                SquidOutSig = (SQUID_MEAN_N + SquidNoise) +
                        SQUID_OUTPUT * cos(TWOPI *
                        (SquidInSig - SQUID_SKEW));
        ADVal = (int)(SquidOutSig / ADμVoltsPerBit);

/* GAIN-PROBE DETECTION PROCEDURE: average the SQUID
        junction voltage for each phase & for each bias polarity; compute the
        average SQUID voltage (phases 0 & 2), & the peak-to-valley voltage
        (difference between phases 1 & 3)*/
        if(BiasSign == NEGATIVE)
                ADVal *= (-1);
        Probe[ModPhase][BiasSign] = (PROBE_TC *
                                Probe[ModPhase]
        [BiasSign] + ADVal) / (PROBE_TC + 1.);
```

```
/* compute open loop gain */
if(ModPhase == 3) {
        MeanSquidVoltage = AD$\mu$VoltsPerBit *
        (Probe[0][BiasSign] + Probe[2][BiasSign]) / 2.;
        PeakToPeakSquidVoltage = AD$\mu$VoltsPerBit *
                fabs(Probe[1][BiasSign] - Probe[3][BiasSign]);
        Gain[BiasSign] = PeakToPeakSquidVoltage / (2. *
                                SQUID_OUTPUT).
```

What is claimed is:

1. A digital flux tracking loop (dFTL) for tracking input signals to a SQUID comprising:

current means for biasing said SQUID with a current effective to cause said SQUID to output a periodic junction voltage $V_j$ having a period $\Phi_o$, said $V_j$ having an amplitude as a function of magnetic flux $\Phi$ within said SQUID;

first processor means for modulating said magnetic flux within said SQUID by a four-phase modulation current to output at least three junction voltages containing information indicative of flux tracking and modulation lock errors; and second processor means for combining said at least three junction voltages and outputting first and second signals functionally related to said flux tracking and modulation lock errors, respectively, said first and second signals forming feedback signals effective to form a flux tracking loop with said SQUID.

2. A dFTL according to claim 1, wherein said first processor means includes a D/A converter inductively coupled to said SQUID for applying a flux error and modulation signal across said SQUID and a A/D converter for receiving modulate junction voltages from said SQUID and outputting digital values of said modulated junction voltages to said second processor.

3. A dFTL according to claim 2, wherein said D/A converter has an operating range at least slightly greater that $1.5\Phi_o$.

4. A dFTL according to claim 2, wherein said D/A converter and said A/D converter each have a conversion rate at least the number of modulation steps for said modulating said periodic junction voltage.

5. A method for tracking input flux signals to a Squid using a digital flux tracking loop (dFTL), comprising the steps of:

establishing a bias current in said SQUID effective to cause said SQUID to output a periodic junction voltage $V_j$ having a period $\Phi_o$, said $V_j$ having an amplitude as a function of magnetic flux $\Phi$ within said SQUID;

modulating said magnetic flux $\Phi$ in said SQUID with a feedback magnetic flux having values of $\Phi_F$, $\Phi_F+\Phi_n/2$, $\Phi_F-\Phi_n/2$, where $\Phi_F$ is the flux feedback signal and $\Phi_n$ approximates $\Phi_o$, to output at least three junction voltages;

combining said at least three junction voltages to output first and second signals, said first signal is a flux tracking error signal for determining an instantaneous value of $\Phi_F$ and said second signal is a modulation amplitude error representing the deviation of $\Phi_n$ from $\Phi_o$, for correcting $\Phi_n$, where said first and second signals are feedback signals effective to form a flux-locked loop with said SQUID.

6. A method according to claim 5, where said first and second signals are mutually orthogonal.

7. A method according to claim 5, further including the step of testing the magnitude of said $\Phi_F+\Phi_n/2$ modulations against the range of a D/A converter converting said feedback signals to analog form for application to said SQUID and slipping said feedback by plus or minus $\Phi_n/2$ to maintain said feedback to said D/A converter within a defined linear range.

8. A method according to claim 5, further including the step of maintaining a table of values for $\Phi_n$ that is updated by said modulation lock errors to provide a current value of the value $\Phi_n$ for said dFTL as an approximation to $\Phi_o$.

9. A method according to claim 5, further including the step of adjusting said phases for modulating said junction voltage by $\Phi_n/4$ at selected intervals to obtain an output signal functionally related to the open circuit gain for said SQUID and preamplifier circuitry receiving an output signal from said SQUID for use in establishing stable operation of said dFTL.

10. A SQUID system for measuring a small input signal, comprising:

a SQUID, including input signal means for generating a magnetic flux in said SQUID functionally related to said input signal;

current means for biasing said SQUID with a current effective to cause said SQUID to output a periodic junction voltage $V_j$ having a period $\Phi_o$, said $V_j$ having an amplitude as a function of magnetic flux $\Phi$ within said SQUID;

first processor means for modulating said magnetic flux within said SQUID by a four-phase modulation current to output at least three junction voltages containing information indicative of flux tracking and modulation lock errors;

second processor means for combining said at least three junction voltages and outputting first and second signals functionally related to said flux tracking and modulation lock errors, respectively, said first and second signals forming feedback signals effective to form a flux tracking loop with said SQUID; and integrator means for integrating said flux tracking errors and outputting a digital signal functionally related to said input signal.

11. A SQUID system according to claim 10, wherein said first processor means includes a D/A converter inductively coupled to said SQUID for applying a flux error and modulation signal across said SQUID and a A/D converter for receiving modulated junction voltages from said SQUID and outputting digital values of said modulated junction voltages to said second processor.

12. A SQUID system according to claim 11, wherein said D/A converter has an operating range at least slightly greater than $1.5\Phi_o$.

13. A SQUID system according to claim 11, wherein said D/A converter and said A/D converter each have a conversion rate at least the number of modulation steps for said modulating said periodic junction voltage.

* * * * *